(12) United States Patent
Kim et al.

(10) Patent No.: US 11,594,512 B2
(45) Date of Patent: Feb. 28, 2023

(54) METHOD OF MANUFACTURING AN ELECTRONIC DEVICE AND ELECTRONIC DEVICE MANUFACTURED THEREBY

(71) Applicant: Amkor Technology Singapore Holding Pte. Ltd., Singapore (SG)

(72) Inventors: Hwan Kyu Kim, Incheon (KR); Dae Gon Kim, Hwaseong-si (KR); Tae Kyeong Hwang, Seoul (KR); Ji Young Chung, Seongnam-si (KR); Kwangmo Chris Lim, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 16 days.

(21) Appl. No.: 17/195,026

(22) Filed: Mar. 8, 2021

(65) Prior Publication Data

US 2021/0225802 A1      Jul. 22, 2021

Related U.S. Application Data

(63) Continuation of application No. 16/827,068, filed on Mar. 23, 2020, now Pat. No. 10,943,884, which is a
(Continued)

(51) Int. Cl.
*H01L 23/00* (2006.01)
*H01L 21/78* (2006.01)
*H01L 23/498* (2006.01)

(52) U.S. Cl.
CPC .............. *H01L 24/81* (2013.01); *H01L 21/78* (2013.01); *H01L 23/49866* (2013.01);
(Continued)

(58) Field of Classification Search
CPC ................... H01L 24/81; H01L 24/16; H01L 2224/13639; H01L 24/13; H01L 24/94; H01L 23/49866; H01L 2224/13147; H01L 2224/16145; H01L 2224/16503; H01L 2224/8181; H01L 21/78
See application file for complete search history.

(56) References Cited

U.S. PATENT DOCUMENTS 5,558,271 A * 9/1996 Rostoker ........... H01L 23/49811
257/E23.068
6,674,647 B2 * 1/2004 Pierson ................... H01L 24/81
257/E21.511

(Continued)

FOREIGN PATENT DOCUMENTS

WO      2017111802 A1      6/2017

OTHER PUBLICATIONS

International Search Report, International Application No. TW106140739, dated Mar. 22, 2021, 8 pages.

*Primary Examiner* — Joseph C. Nicely
(74) *Attorney, Agent, or Firm* — McAndrews, Held & Malloy, Ltd.

(57) ABSTRACT

Various aspects of this disclosure provide a method of manufacturing an electronic device and an electronic device manufactured thereby. As a non-limiting example, various aspects of this disclosure provide a method of manufacturing an electronic device, and an electronic device manufactured thereby, that utilizes ink to form an intermetallic bond between respective conductive interconnection structures of a semiconductor die and a substrate.

20 Claims, 6 Drawing Sheets

Related U.S. Application Data continuation of application No. 15/673,565, filed on Aug. 10, 2017, now Pat. No. 10,600,755.

(52) U.S. Cl.
CPC ............. *H01L 24/13* (2013.01); *H01L 24/16* (2013.01); *H01L 24/94* (2013.01); *H01L 2224/13147* (2013.01); *H01L 2224/13639* (2013.01); *H01L 2224/16145* (2013.01); *H01L 2224/16225* (2013.01); *H01L 2224/16227* (2013.01); *H01L 2224/16503* (2013.01); *H01L 2224/8102* (2013.01); *H01L 2224/81022* (2013.01); *H01L 2224/8181* (2013.01); *H01L 2224/81191* (2013.01); *H01L 2224/81193* (2013.01); *H01L 2224/81203* (2013.01); *H01L 2225/06513* (2013.01)

(56) References Cited

U.S. PATENT DOCUMENTS

| | | | |
|---|---|---|---|
| 9,559,075 B1* | 1/2017 | Baloglu | H01L 24/03 |
| 2013/0153644 A1 | 6/2013 | Hojo et al. | |
| 2013/0307144 A1* | 11/2013 | Yu | H01L 25/0657 |
| | | | 257/737 |
| 2015/0162292 A1* | 6/2015 | Machida | H01L 24/13 |
| | | | 257/737 |
| 2015/0163903 A1* | 6/2015 | Wada | H05K 1/0313 |
| | | | 361/760 |
| 2016/0351529 A1 | 12/2016 | Brunschwiler et al. | |

\* cited by examiner

Figure 3B ically indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

METHOD OF MANUFACTURING AN ELECTRONIC DEVICE AND ELECTRONIC DEVICE MANUFACTURED THEREBY

CROSS-REFERENCE TO RELATED APPLICATIONS/INCORPORATION BY REFERENCE

This patent application is a continuation of U.S. patent application Ser. No. 16/827,068, filed on Mar. 23, 2020, and titled, "METHOD OF MANUFACTURING AN ELECTRONIC DEVICE AND ELECTRONIC DEVICE MANUFACTURED THEREBY, expected to issue as U.S. Pat. No. 10,943,884; which is a continuation of U.S. patent application Ser. No. 15/673,565, filed Aug. 10, 2017, and titled "METHOD OF MANUFACTURING AN ELECTRONIC DEVICE AND ELECTRONIC DEVICE MANUFACTURED THEREBY," now U.S. Pat. No. 10,600,755; which is related to U.S. patent application Ser. No. 14/963,037, filed on Dec. 8, 2015, and titled "Transient Interface Grading Bonding for Metal Bonds"; each of which is hereby incorporated herein by reference in its entirety.

BACKGROUND

Present semiconductor devices and methods for manufacturing electronic devices are inadequate, for example resulting in manufacturing processes that are too time-consuming, involve too many steps, and/or are too costly, resulting in electronic device with unreliable connections, with interconnection structures having suboptimal dimensions, etc. Further limitations and disadvantages of conventional and traditional approaches will become apparent to one of skill in the art, through comparison of such approaches with the present disclosure as set forth in the remainder of the present application with reference to the drawings.

SUMMARY

Various aspects of this disclosure provide a method of manufacturing an electronic device and an electronic device manufactured thereby. As a non-limiting example, various aspects of this disclosure provide a method of manufacturing an electronic device, and an electronic device manufactured thereby, that utilizes ink to form an intermetallic bond between respective conductive interconnection structures of a semiconductor die and a substrate.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Various aspects of the present disclosure relate to a method of manufacturing (or fabricating) an electronic device (e.g., a semiconductor device, integrated circuit, etc.), and an electronic device manufactured thereby.

Along with current tendencies toward a lightweight, slim and small-sized product, it is generally desirable for electronic devices that are incorporated into such products to have a reduced size and to have increased functionality. To meet electronic device goals, various electronic device packaging technologies have been developed, some of which may for example include the incorporation of multiple semiconductor dies into a single electronic device package. Such packages may also, for example, include two-dimensional or three-dimensional arrays of semiconductor dies.

Some of such packaging technologies may, for example, utilize solder bumps, in addition to or instead of wire bonding technology for the attachment of electronic components to substrates and/or for the attachment of electronic components directly to each other. Such solder bumping technology, however, has various limitations (e.g., size limitations in any or all dimensions, process complexity limitations, reliability limitations, etc.).

Accordingly, various aspects of the present disclosure provide a method of manufacturing (or fabricating) an electronic device (e.g., a semiconductor device), and an electronic device manufactured thereby. Such method may, for example, comprise providing a semiconductor die having metal bumps (or any of a variety of conductive interconnection structures) protruding from one surface thereof, dipping tips of the metal bumps into metal ink, aligning the semiconductor die on a substrate (many examples of which are provided herein), and bonding the semiconductor die to the substrate through thermocompression bonding.

The metal ink may, for example, be provided in a state in which conductive metal ions, metal molecules, and/or metal particles are dispersed in a solvent. The conductive metal ions, the metal molecules, and/or the metal particles may, for example, comprise or be made entirely of silver (Ag). The metal ink may, for example, be provided in an ink holder, and the metal bumps of the semiconductor die may be dipped (e.g., downward) into the metal ink in a state in which they are oriented to face downward.

Also, for example, thermocompression bonding may be performed on the metal bumps at a temperature between 25° C. and 400° C. (or in a range from 25° C. to 400° C.). Additionally, for example, thermocompression bonding may be performed on the metal bumps by applying a pressure between 0.1 bar and 20 Kbar (or in a range from 0.1 bar to 20 Kbar) to the metal bumps.

In an example implementation, after performing a cleaning operation on the semiconductor die, a die-handling apparatus (e.g., a die pick-and-place tool, component pick-up device, stage, etc.) may be utilized to manipulate (e.g., pick up, move, dip, set down, etc.) the die, for example to dip the die into the metal ink.

Also for example, the semiconductor die may be positioned to align the metal bumps of the semiconductor die to respective metal bumps (or any of a variety of types of conductive interconnection structures) on a substrate (many examples of which are provided herein).

Bonding may then, for example, be performed to bond the semiconductor die to the substrate. For example, thermocompression bonding may be performed in a state in which the metal bumps of the semiconductor die are brought into contact with the metal bumps of the substrate, for example with the metal ink positioned between corresponding metal bumps of the semiconductor die and the substrate.

Various aspects of this disclosure also provide an electronic device (e.g., a semiconductor device, etc.) manufacturing utilizing any or all of the steps discussed herein. For example, a semiconductor device may comprise metal bumps protruding from one side (or surface) thereof; a substrate (many examples of which are provided herein) including metal bumps corresponding to the metal bumps of the semiconductor die; and a bonding region formed by bonding the metal bumps of the semiconductor die to the metal bumps of the substrate, wherein the bonding region comprises an intermetallic compound.

The intermetallic compound may, for example, be formed using the metal bumps of the semiconductor die, the metal bumps of the substrate, and the metal ink formed between the metal bumps of the semiconductor die and the metal bumps of the substrate. The metal ink may, for example, form or enhance the forming of the intermetallic compound, and may be provided in a state in which conductive metal ions, metal molecules, and/or metal particles are dispersed in a solvent. In an example implementation, the conductive metal ions, the metal molecules, and/or the metal particles may comprise or be made entirely of silver (Ag).

Various aspects of the present disclosure provide a method of manufacturing an electronic device, where the method comprises: providing a substrate comprising a substrate conductive interconnection structure; providing a semiconductor die comprising a die conductive interconnection structure protruding from a first surface of the die; coating at least a first surface of the die conductive interconnection structure and/or at least a first surface of the substrate conductive interconnection structure with an ink that comprises metal; and bonding the first surface of the die conductive interconnection structure and the first surface of the substrate conductive interconnection structure. The substrate may, for example, comprise a wafer or panel of substrates (e.g., prior to singulation).

Providing the semiconductor die may, for example, comprise providing a semiconductor wafer comprising the semiconductor die and one or more other semiconductor dies, where the method comprises after said providing (or as part of said providing), singulating the semiconductor die from the provided wafer. The die conductive interconnection structure may, for example, comprise a metal pillar (or post). The first surface of the die conductive interconnection structure may, for example, be planar or non-planar.

The coating of the die conductive interconnection structure may, for example, comprise coating at least the first surface of the die conductive interconnection structure with the ink. The coating of the die conductive interconnection structure may, for example, comprise dipping at least a first respective surface of the die conductive interconnection structure and/or a first respective surface of the substrate conductive interconnection structure in the ink.

The method may, for example, comprise prior to performing the coating, singulating the semiconductor die from a semiconductor wafer and, said coating may comprise coating at least a first respective surface of the die conductive interconnection structure of the singulated semiconductor die with the ink. The metal of the ink may, for example, comprise metal ions, metal molecules, and/or metal particular dispersed in a solvent. The method may, for example, comprise prior to performing the coating, forming the ink on an ink carrier structure, wherein the coating comprises dipping at least the first surface of the die conductive interconnection structure in the ink.

Various aspects of the present disclosure provide a method of manufacturing an electronic device, where the method comprises providing a substrate comprising a substrate conductive interconnection structure; providing a semiconductor die comprising a die conductive interconnection structure protruding from a first side of the die; and pressing a first surface of the die conductive interconnection structure and a first surface of the substrate conductive interconnection structure together with at least one layer of the ink at an interface between the first surface of the die conductive interconnection structure and the first surface of the substrate conductive interconnection structure.

The pressing may, for example, comprise performing the pressing utilizing a thermocompression bonding process. The bonding utilizing the thermocompression bonding process may, for example, comprise performing the thermocompression bonding without ultrasonic vibration and/or without solder. The thermocompression bonding process may, for example, comprise performing thermocompression bonding at a temperature between 25° C. and 400° C. and/or at a pressure between 0.1 bar and 20 Kbar.

The bonding may, for example, comprise pressing the first surface of the die conductive interconnection structure and the first surface of the substrate conductive interconnection structure together with only the ink between the first surface of the die conductive interconnection structure and the first surface of the substrate conductive interconnection structure.

Various aspects of the present disclosure provide an electronic device, for example a semiconductor device, manufactured in accordance with any or all of the manufacturing process steps discussed herein.

Various aspects of the present disclosure provide an electronic device that comprises: a substrate comprising a substrate conductive interconnection structure; a semiconductor die comprising a die conductive interconnection structure; and a bonding region between a first end of the substrate conductive interconnection structure and a first end of the die conductive interconnection structure, wherein the bonding region comprises: metal from the first end of the die conductive interconnection structure; metal from the first end of the substrate conductive interconnection structure; and metal from an ink.

The first end of the substrate conductive interconnection structure and/or the first end of the die conductive interconnection structure may, for example, be non-planar. The substrate conductive interconnection structure may for example comprise copper, the die conductive interconnection structure may for example comprise copper, and the metal from the ink may for example comprise silver. The bonding region may, for example, comprise an intermetallic bond that comprises the metal from the first end of the die conductive interconnection structure, the metal from the first end of the substrate conductive interconnection structure, and/or the metal from the ink. The bonding region may also, for example, comprise a first region comprising an intermetallic bond between a first interconnection structure and metal from the ink, a second region comprising only metal from the ink, and a third region comprising an intermetallic bond between a second interconnection structure and metal from the ink.

Various aspects of the present disclosure will now be described in detail with reference to the accompanying drawings such that they may be readily practiced by those skilled in the art. Note that common reference numerals may be used throughout the drawings and the detailed description to indicate the same (or similar) elements.

Figure 1:
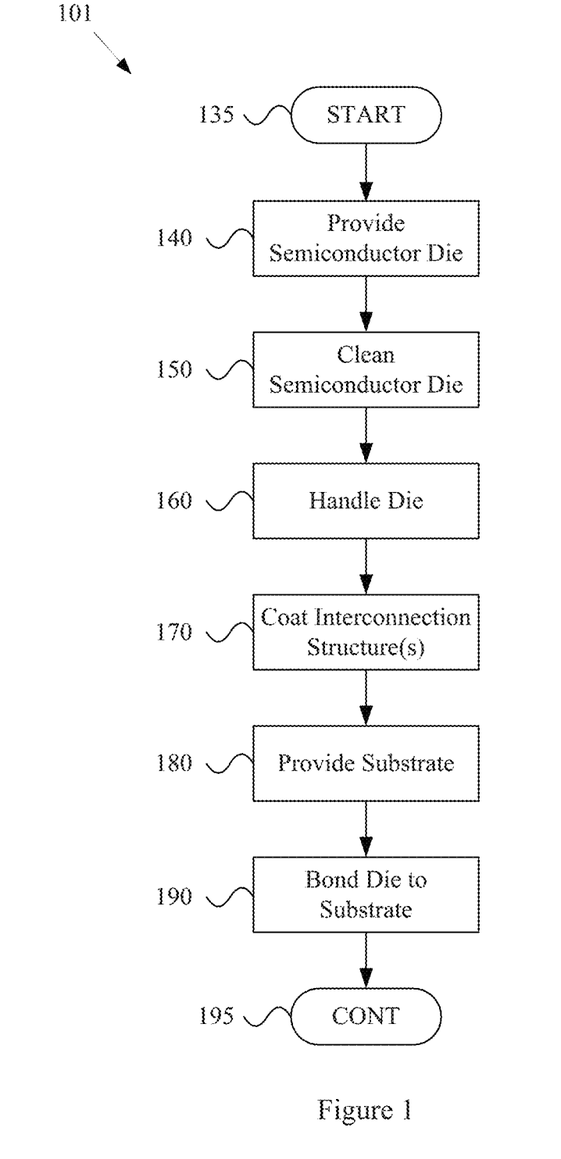
FIG. 1 shows a flow diagram of an example method of manufacturing an electronic device, in accordance with various aspects of the present disclosure.

FIG. 1 shows a flow diagram of an example method 101 of manufacturing an electronic device (e.g., a semiconductor device, etc.), in accordance with various aspects of the present disclosure. FIGS. 2A-2F show cross-sectional views of an example electronic device (e.g., a semiconductor device, etc.) during and/or after manufacturing in accordance with the example method 101 of FIG. 1. The following discussion will generally refer to FIG. 1 and to FIGS. 2A-2F together.

Referring to FIG. 1, the example method 101 of manufacturing a semiconductor device may comprise: (140) providing a semiconductor die, (150) cleaning the semiconductor die, (160) handling the semiconductor die, (170) coating an interconnection structure with ink, (180) providing a substrate, and (190) bonding the semiconductor die to the substrate. Various blocks (or steps, stages, processes, etc.) of the example method 101 illustrated FIG. 1 will be now be described with reference to FIGS. 2A-2F The example method 101 may begin executing at block 135. The example method 101 may begin executing in response to any of a variety of causes or conditions, non-limiting examples of which are provided herein. For example, the example method 101 may begin executing in response to receiving an electrical signal (e.g., from an upstream process, from a central controller, etc.) to begin, upon arrival of any or all materials necessary to perform the method 101, upon user command, etc. Also for example, the example method 101 may begin executing in response to receiving operational flow from any other methods or method blocks discussed herein (or elsewhere). The scope of this disclosure should not be limited by characteristics of any particular initiating cause or condition.

Figure 2A:
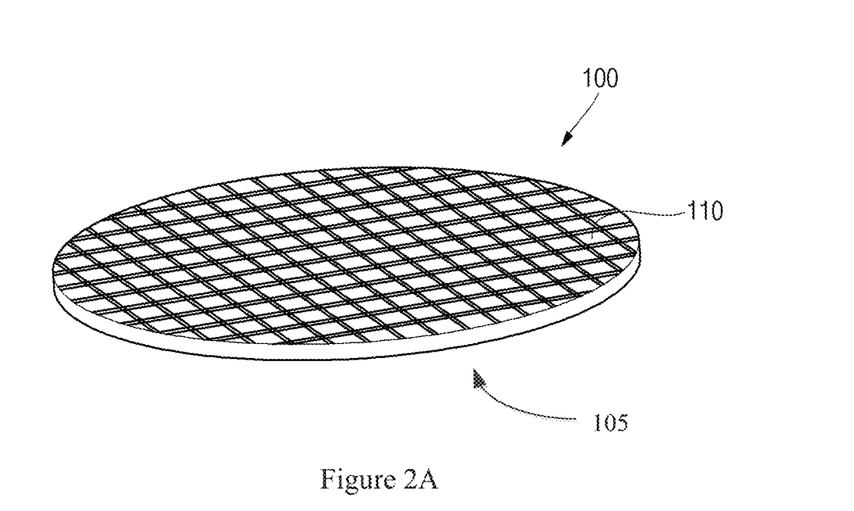
FIGS. 2A to 2F show cross-sectional views illustrating various steps of a method of manufacturing a semiconductor device, in accordance with various aspects of the present disclosure.

The example method 101 may, at block 140, comprise providing the semiconductor die. Block 140 may comprise providing the semiconductor die in any of a variety of manners, non-limiting examples of which are provided herein. Various example aspects of block 140 are shown at FIG. 2A.

Block 140 may, for example, comprise receiving a wafer 100 of semiconductor dies 110 (e.g., formed on an active surface of the wafer 100). The wafer 100 may, for example, be provided attached to a carrier or stage (e.g., adhered to the carrier with adhesive, mounting tape or die-attach tape, vacuum-held, mechanically clipped, etc.). The wafer 100 may, for example, be provided in a non-diced state, a fully-diced state, or a partially-diced state. The wafer 100 may also, for example, be provided in the form of a reconstituted wafer (e.g., with dies held together with molding material or other dielectric material, etc.). The wafer 100 may, for example, be provided in a state in which the wafer 100 has been partially diced or fully diced, for example by partially cutting through the wafer 100 or fully cutting through the wafer 100 along dicing (or singulation or scribing) lines of the wafer 100. Note that the wafer 100 may, for example, comprise a wafer or panel-shaped carrier to which a plurality of previously-diced dies are attached.

In an example implementation, the wafer 100 may be provided with a side of the wafer 100 (e.g., a back or inactive side, or a front or active side), as a whole or as an array of individual singulated dies, mounted to a carrier with a mounting tape. Though not shown in FIG. 2A, such a carrier and mounting tape may, for example be positioned under the wafer 100 as designated by label 105 in FIG. 2A.

The semiconductor die 110 (e.g., a plurality thereof, etc.) may, for example, comprise characteristics of any of a variety of types of dies. For example, the semiconductor die 110 may comprise a processor, a digital signal processor (DSP), a networking processor, a power management unit, an audio and/or video processor, a wireless communication circuit, a system-on-chip (SoC) processor, a sensor or sensor processor, an application specific integrated circuit (ASIC), a discrete logic device, a transistor, etc. Note that although this disclosure generally refers to semiconductor dies, the scope of this disclosure is not limited thereto. For example, the aspects of this disclosure also apply to passive electronic components (e.g., resistors, capacitors, inductors, etc.), micro-electro-mechanical system (MEMS) components, any combination of such components, etc. Also note that the die 110 may also be (or comprise) a signal distribution structure. For example, the die 110 need not comprise functional electronic components, for example being entirely dedicated to the distribution of electrical signals.

The semiconductor die 110 may, for example, comprise conductive interconnection structures for providing electrical contact with other components (e.g., with other substrates, such as mother boards, package substrates, interposers, signal distribution structures, other dies, other packaged electronic devices, etc.). Such conductive interconnection structures may, for example, extend from an active side of the semiconductor die 110.

The conductive interconnection structures (e.g., as designated in various drawings by label 111) may, for example, comprise characteristics of any of a variety of different types of conductive interconnection structures. For example, the conductive interconnection structures may comprise metal pillars or posts (e.g., copper pillars, etc.), conductive bumps or balls (e.g., copper bumps or balls, etc.), metal wires (e.g., die bonding wires, etc.), pads, etc.

In an example implementation, the conductive interconnection structures may comprise metal pillars (or posts). Such metal pillars may, for example, each comprise a first end that faces away from the semiconductor die 110 and with which electrical and/or mechanical connection is to made with another conductive interconnection structure (e.g., of a substrate, etc.). Such first end may, for example, be planar (e.g., parallel to a planar surface of the semiconductor die 110 from which the conductive interconnection structure extends. Such first end may also, for example, be concave or convex. Such a configuration is discussed in detail in U.S. patent application Ser. No. 15/387,016, filed Dec. 21, 2016, and titled "Semiconductor Product with Interlocking Metal-to-Metal Bonds and Method for Manufacturing thereof," the entire content of which is hereby incorporated herein by reference in its entirety. Such metal pillars (or posts) may, for example, be uncapped (e.g., not capped with a layer of solder or other reflowable material, not capped with a cap layer of any metal different from the metal of the pillar, etc.).

In general, block 140 may comprise providing the semiconductor die. Accordingly, the scope of this disclosure should not be limited by characteristics of any particular semiconductor die (or wafer) or by characteristics of any particular manner of providing a semiconductor die (or wafer).

Figure 2B:
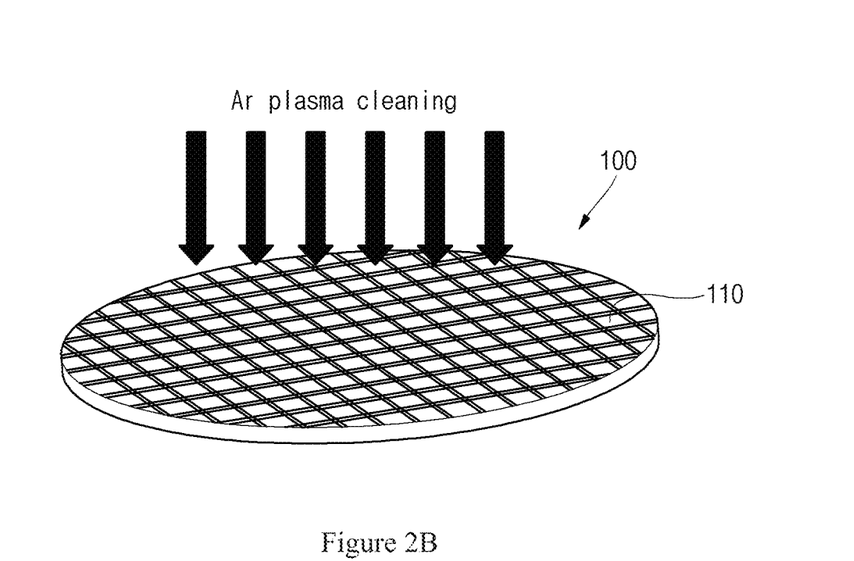

The example method 101 may, at block 150, comprise cleaning the semiconductor die. Block 150 may comprise performing such cleaning in any of a variety of manners, non-limiting examples of which are provided herein. Various example aspects of block 150 are shown at FIG. 2B.

In an example implementation, block 150 may comprise cleaning as least one surface of a wafer 100 comprising any number of the semiconductor dies 110. For example, block 150 may comprise cleaning the side of the wafer 100 from which the conductive interconnection structures extend (e.g., an active side of the wafer).

For example, block 150 may comprise performing the cleaning, at least in part, by activating gases, such as argon (Ar), hydrogen ($H_2$) or oxygen ($O_2$), injected alone or in combination, into a plasma state using electrical energy to cause the same to collide with the wafer 100 (e.g., including any conductive interconnection structures formed thereon). In addition to (or instead of) performing plasma cleaning, block 150 may also comprise cleaning by physical treatment or wet cleaning by chemical treatment.

Note that block 150 may comprise performing the cleaning at the wafer level, at the individual die level, at the level of a panel on which a plurality of individual dies are held, etc.

Also note that, although not shown in FIG. 1, the cleaning may also be applied to a substrate such as that provided at block 180.

In general, block 150 may comprise cleaning the semiconductor die. Accordingly, the scope of this disclosure should not be limited by characteristics of any particular manner of performing such cleaning.

Figure 2C:
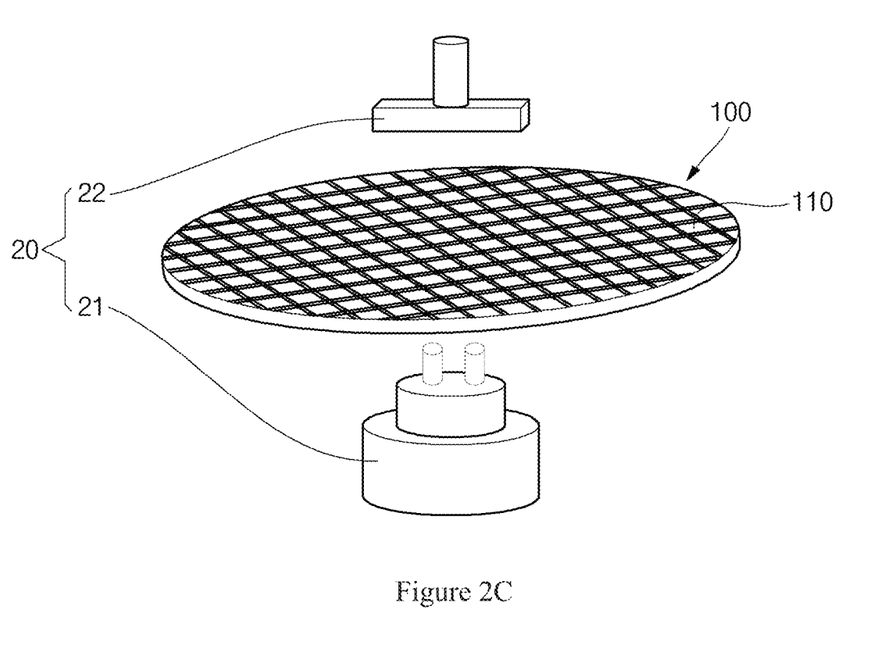

The example method 101 may, at block 160, comprise handling the semiconductor die. Block 160 may comprise performing such handling in any of a variety of manners, non-limiting examples of which are provided herein. Various example aspects of block 160 are shown at FIG. 2C.

For example, block 160 may comprise picking up an individual die 110 from the wafer 100 (or carrier). As shown at FIG. 2C, a die-handling apparatus 20 (e.g., a die manipulation tool, a die pick-and-place tool, a component pick-up device, a stage, etc.), or portion thereof, may be utilized to pick up one of the semiconductor dies 110.

In an example implementation in which the back surface of the wafer 100 (or dies 110) is adhered to a stage (e.g., utilizing mounting tape, utilizing a vacuum, etc.) of the die-handling apparatus 20, block 160 may comprise picking up an individual semiconductor die 110 using a die manipulation tool 22 (e.g., a die pick-and-place tool, a die pick-up tool, or component pick-up device, etc.) approaching a front surface of the wafer 100. For example, the die manipulation tool 22 may comprise a vacuum nozzle for picking up the semiconductor die 110. The apparatus 20 may also, for example, comprise a die-eject tool 21.

Note that one or more die manipulation tools 22 may be utilized to orient the picked-up semiconductor die 110 in an orientation in which the active side of the semiconductor die 110, including conductive interconnection structures extending therefrom, is facing downward. For example, though an initial die pick-up operation may be performed with a die manipulation tool 22 at the front (or active) side of the semiconductor die 110, the die 110 may then be transferred to another die manipulation tool 22 that holds the semiconductor die 110 from the back side. Alternatively, the semiconductor die 110 may be originally oriented back-side-up on the stage so that the die manipulation tool 22 may initially pick up the semiconductor die 110 from the back side.

As shown in FIG. 2D, the die manipulation tool 22 may hold the semiconductor die 110 from the back side so that the conductive interconnection structures 111 (e.g., metal pillars, metal bumps, etc.) face downward.

As discussed herein the conductive interconnection structures 111 may protrude from respective conductive pads of the semiconductor die 110 (or may, for example, be extended pads of the semiconductor die 110). As discussed herein with regard to block 140, the semiconductor die 110 may be originally provided having such conductive interconnection structures 111 and/or block 140 may comprise forming the conductive interconnection structures. In an example implementation, each of the conductive interconnection structures 111 comprises a metal pillar (or bump) that protrudes a predetermined length from a respective conductive pad on the front (or active) surface of the semiconductor die 110.

Note that the conductive interconnection structures 111 may all protrude from the semiconductor die 110 a same distance. For example, a planarization process may be utilized (e.g., at block 140 or another block) to ensure that each of the conductive interconnection structures 111 protrude a same distance from the semiconductor die 110. Alternatively, a tightly controlled process may be utilized when originally forming such conductive interconnection structures 111 to ensure that each of the conductive interconnection structures 111 protrude a same distance from the semiconductor die 110.

As discussed herein, the conductive interconnection structures 111 may comprise any of a variety of characteristics. For example, the conductive interconnection structures 111 may comprise metal pillars (or posts), metal bumps, conductive pillars (or posts), conductive bumps, conductive balls, etc. The conductive interconnection structures 111 may, for example, be formed of copper (Cu), gold (Au), silver (Ag), aluminum (Al), equivalents thereof, alloys thereof, etc.

In general, block 160 may comprise handling the semiconductor die 110. Accordingly, the scope of this disclosure should not be limited by characteristics of any particular manner of handling a semiconductor die or by characteristics of any particular semiconductor die.

Figure 2D:
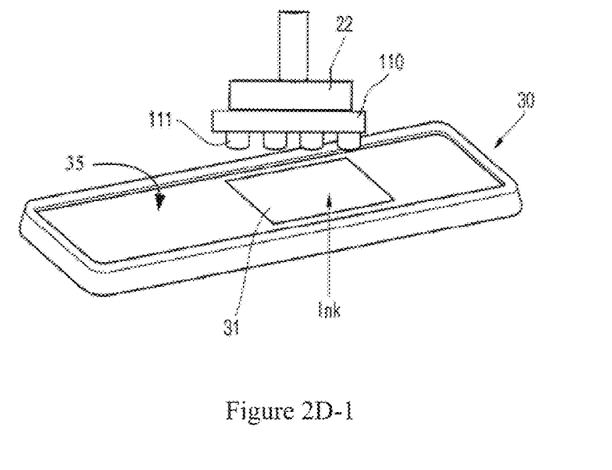
Figure 2D:
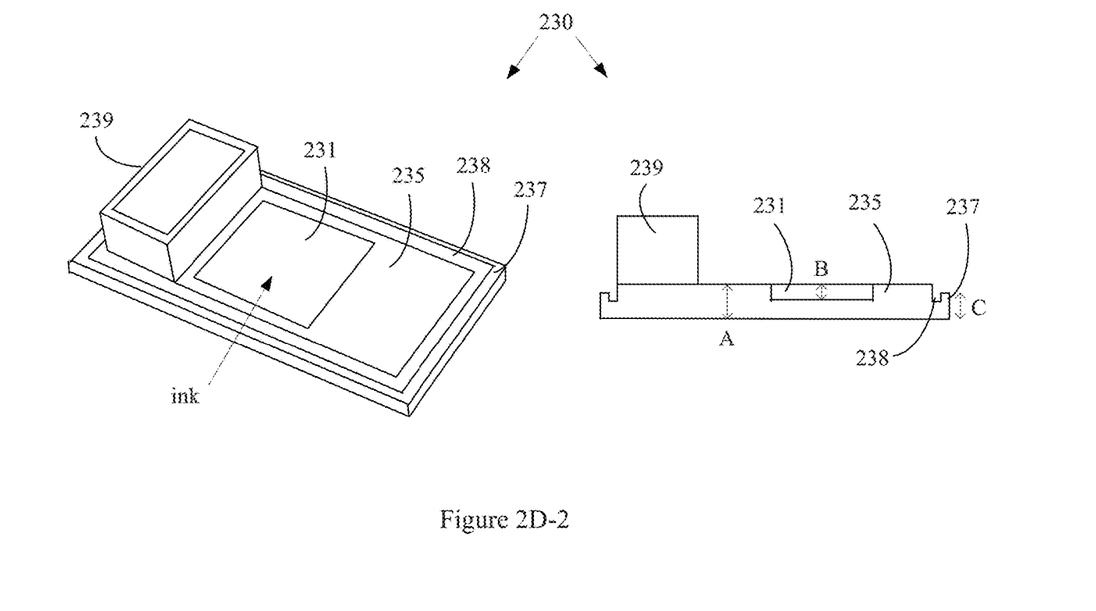

The example method 101 may, at block 170, comprise coating one or more conductive interconnection structures with ink. Block 170 may comprise performing such coating in any of a variety of manners, non-limiting examples of which are provided herein. Various example aspects of block 170 are shown at FIGS. 2D-1 and 2D-2.

For example, as shown in FIG. 2D-1, block 170 may comprise dipping the conductive interconnection structures 111 that extend downward from the semiconductor die 110 into an ink (e.g., a metal or metal-filled ink, etc.) that is provided in a dipping cavity 31 (or a well or a pool, etc.) of an ink holder 30. In an example implementation, the ink holder 30 may be generally plate-shaped and may comprise an upper surface 35, dipping cavity 31 (or indentation, pool, well, etc.) formed in the upper surface 35, and groove formed in at least one major surface (e.g., in a top surface, etc.). The ink may, for example, fill the dipping cavity 31.

FIG. 2D-2 provides another example implementation of an ink holder 230. FIG. 2D-2 shows perspective and side views of the example ink holder 230. The example ink holders 30 and 230 of FIGS. 2D-1 and 2D-2 may share any or all characteristics. For example any of the characteristics of the example ink holder 30 may be incorporated into the example ink holder 230 and vice versa.

The example ink (or material) holder 230 of FIG. 2D-2 may, for example, comprise an ink (or material) tank 239 on an upper surface 235. A dipping cavity 231 (or indentation, well, pool, etc.) may be formed in the upper surface 235. A perimeter groove 238 may be formed around the perimeter of the upper surface 235, along with a perimeter shelf 237. The perimeter groove 238 may, for example, accommodate ink flow (e.g., of excess ink, etc.). In an example implementation, the dimension A may be 6.5 mm, the dimension B may be 10 um, and the dimension C may be 6 mm. Any of such dimensions may be modified in accordance with various implementation parameters. For example, dimension B (e.g., the depth of the ink cavity 213) may be set in accordance with the amount of ink desired on the interconnection structures 111, with the amount of manufacturing variation in the co-planarity of the ends of the interconnection structures 111, etc. For example, the dimension B may be set to be less than 8 um. Also for example, the dimension B may be set to be less than 5 um or less than 2 um. Additionally for example, in various circumstances, a controllable thin coat of ink may be spread on the upper surface 35 without utilizing a groove 31. In an example implementation, the depth B of the dipping cavity 231 and/or the thickness of the ink may be in the range of 1 nm to 10 um. Additionally, though in a first implementation, the ink might only cover the bottom end surfaces of the interconnection structures 111, in other implementations the ink may also be present on side surfaces of the interconnections structures 111 bordering such end surfaces. The dipping cavity 231 may comprise any of a variety of X/Y dimensional characteristics.

The ink may be formed on the ink holder 30/230 in any of a variety of manners, for example by printing, spraying, dipping, spin-coating, vapor-depositing, squeegeeing, scraping, etc. The ink may, for example, be formed on the ink holder 30/230 (e.g., in the dipping cavity 31/231) to a predetermined depth that coincides with the amount of ink to be formed on the conductive interconnection structures 111 (e.g., within a particular amount of manufacturing tolerance). For example, the predetermined depth may be set such that, considering a maximum expected (or accepted) amount of non-coplanarity of the ends of the conductive interconnection structures, would still result in at least the end surface of each of the conductive interconnection structures 111 being coated with the ink.

In an example implementation, before each application of ink onto the interconnection structures 111, the ink cavity 31/231 may be filled with metal ink. For example, the ink (or material) tank 239 (or reservoir) and/or the dipping cavity 231 may be moved horizontally relative to each other (e.g., the ink cavity 231 may be moved back-and-forth under the ink tank 239, the ink tank 239 may be moved back-and-forth over the ink cavity 231, etc.).

In an example implementation, at least the end surfaces of the conductive interconnection structures 111 may be covered with the ink. Note, however, that at least an end portion of the lateral sides of the conductive interconnection structures 111 may also be covered with the ink.

As discussed herein, with the ink coated on the conductive interconnection structures 111 (or ends thereof), the conductive interconnections structures 111 may be stacked on and bonded to corresponding conductive interconnection structures of a substrate (e.g., a circuit board, a mother board, a package substrate, an interposer, an interposer formed on a semiconductor wafer or formed on a glass or metal plate, a signal distribution structure, a signal distribution structure formed on a semiconductor wafer or formed on a glass or metal plate, another electronic package, another functional semiconductor die, etc.), for example utilizing thermocompression bonding. To enhance the bonding, which may for example comprise a solderless metal-to-metal bond, the ink (e.g., a metal link, etc.) may be formed of a metal ink material, for example comprising silver (Ag). For example, the ink may be formed (or provided) in a state in which conductive metal ions, metal molecules or metal particles (e.g., comprising silver (Ag), comprising only silver, etc.) are dispersed in a solvent (e.g., ethanol, anisole, hexylamine, etc.). For example, as opposed to solder paste, the ink may be free of tin, free of copper, and/or free of flux. Such formation may, for example, reduce or eliminate joint or bump integrity issues that are inherent or often present in copper-tin (Cu—Sn) type joints. It should be noted that during the bonding process, a portion of the ink may be forced out of the joint and create a slight conductive bulge protruding laterally from the joint. In an example implementation, the solvent of the ink (or other material) may all be removed from the final bonding joint, leaving only the metal in the ink.

Since such bonding may be efficiently and reliably formed without reflowing solder, manufacturing efficiency and high reliability at a fine pitch spacing may be achieved. The ink (or metal within) may, for example, enhance electromigration. Also for example, when the thermocompression bonding is performed using the ink, enhanced electrical characteristics (e.g., low resistivity, etc.) may be achieved between the conductive interconnection structures 111 of the semiconductor die 110 and corresponding conductive interconnection structures of the substrate.

In the example implementations discussed herein, only a single semiconductor die 110 at a time is manipulated and coated with the ink. It should be understood that a plurality of such dies 110 (e.g., in an array, in a reconstituted wafer, in a semiconductor wafer, in a panel, etc.) may be simultaneously coated.

Also, in the example implementations discussed herein, the conductive interconnection structures 111 of the semiconductor die 110 are coated with the ink. It should be understood that the corresponding conductive interconnection structures (e.g., of the substrate, etc.) may also (or alternatively) be coated with the ink. For example, a substrate manipulation tool may be utilized to dip conductive interconnection structures of a circuit board, mother board, packaging substrate, interposer, signal distribution structure, other die, etc., in the ink (or otherwise apply such ink).

In general, block 170 may comprise coating one or more conductive interconnection structures with ink. Accordingly, the scope of this disclosure should not be limited by characteristics of any particular manner of coating with ink or of any particular type of ink.

Figure 2E:
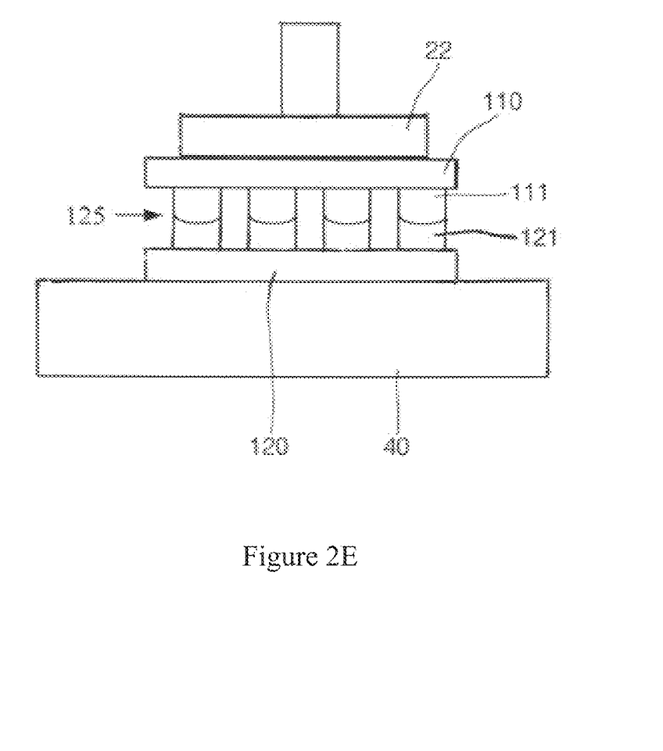

The example method 101 may, at block 180, comprise providing a substrate. Block 180 may comprise performing such providing in any of a variety of manners, non-limiting examples of which are provided herein. Various example aspects of block 180 are shown at FIG. 2E.

The substrate (e.g., the substrate 120 of FIG. 2E) may comprise any of a variety of characteristics. For example, the substrate may comprise a circuit board substrate, a mother board substrate, a package substrate, a cored or coreless substrate, a laminate substrate, an interposer, an interposer formed on a semiconductor wafer or formed on a glass or metal plate, a signal distribution structure, a signal distribution structure formed on a semiconductor wafer or formed on a glass or metal plate, an electronic component package (e.g., a stackable package, etc.), a semiconductor die, a signal distribution structure formed in a semiconductor die (or wafer), a substrate panel, a substrate wafer, etc. The substrate may, for example, be provided as part of a wafer of substrates, a reconstituted wafer of substrates, a panel of substrates, etc.

The substrate 120 may, for example, be provided having conductive interconnection structures 121 already formed thereon, or block 180 may comprises forming such structures. The conductive interconnection structures 121 may, for example, share any or all characteristics with the conductive interconnection structures 121 of the semiconductor die 110 discussed herein. The conductive interconnection structures 121 may, for example, comprise pads or lands of the substrate 120. The conductive interconnection structures 121 may, for example, comprise metal pillars (or posts), metal bumps, conductive pedestals, etc., of the substrate 120.

In an example implementation (discussed herein) in which the conductive interconnection structures 111 have planar ends, the ends of the conductive interconnection structures 121 may also have planar ends. In another example implementation (discussed herein) in which the conductive interconnection structures 111 have convex ends, the ends of the conductive interconnection structures 121 may have concave ends. In still another example implementation (discussed herein) in which the conductive interconnection structures 111 have concave ends, the ends of the conductive interconnection structures 121 may have convex ends.

Though as shown in FIG. 2E, the lateral dimensions of the conductive interconnection structures 111 and the conductive interconnection structures 121 are equal, this need not be the case. For example, the conductive interconnection structures 121 of the substrate 120 may be laterally wider than the conductive interconnection structures 111 of the semiconductor die 110 (e.g., in one-dimension, in two-dimensions, etc.).

Though as shown in FIG. 2E, the conductive interconnection structures 121 of the substrate 120 and the conductive interconnection structures 111 of the semiconductor die 110 are generally cylindrical-shaped (e.g., with a circular cross-section), this need not be the case. For example, the conductive interconnection structures 111 and/or the conductive interconnection structures 121 may comprise cross-section(s) that are oval-shaped, rectangular-shaped, trapezoid-shaped, diamond-shaped, etc.

In general, block 180 may comprise providing a substrate. Accordingly, the scope of this disclosure should not be limited by characteristics of any particular manner of providing a substrate or by characteristics of any particular substrate or type thereof.

Figure 2F:
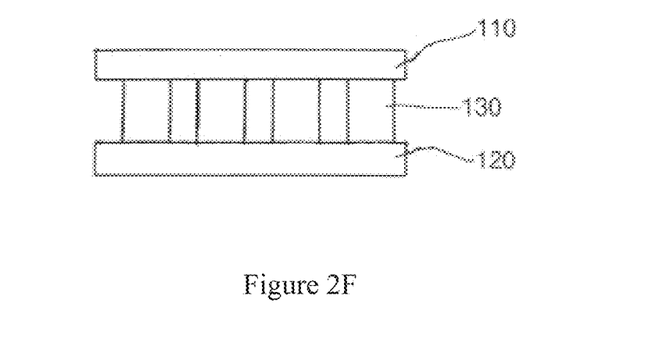

The example method 101 may, at block 190, comprise bonding the semiconductor die to the substrate. Block 190 may comprise performing such bonding in any of a variety of manners, non-limiting examples of which are provided herein. Various example aspects of block 190 are shown at FIG. 2E and FIG. 2F.

Referring to FIG. 2E, block 190 may comprise aligning the semiconductor die 110 (e.g., as held by the die manipulation tool 22) (e.g., the conductive interconnection structures 111 thereof), to the substrate 120 (e.g., the conductive interconnection structures 121 thereof). As shown in FIG. 2E, the substrate 120 may be coupled to a carrier 40 (or stage).

Block 190 may, for example, comprise bringing corresponding end surfaces of the conductive interconnection structures 111 of the semiconductor die 110 into contact with corresponding end surfaces of the conductive interconnection structures 121 of the substrate 120. As shown in FIG. 2E, at this point, there is a clear interface 125 between corresponding conductive interconnection structures 111/121. This interface 125 may, for example, comprise the ink that was coated on the conductive interconnection structures 111 at block 170.

Note that in instances where the opposite facing ends of the conductive interconnection structures 111/121 have non-matching sizes, or in instances in which the conductive interconnection structures 111/121 are imperfectly aligned, there may be a portion of the ink that is not directly between the conductive interconnection structures 111/121. In such case, after the bonding is performed, there may be remnants of the ink (e.g., metal ions, metal molecules, metal particles, solvent, etc.). Such remnants may, for example, be removed during a later cleaning process, may be encapsulated along with the conductive interconnection structures 111/121 during a later manufacturing step, etc.

Block 190 may then, for example, comprise applying heat and/or pressure (e.g., utilizing thermocompression bonding, etc.) to bond the conductive interconnection structures 111/121 to each other. In an example implementation utilizing thermocompression bonding, such bonding provides for the conductive interconnection structures 111 of the semiconductor die 110 having the ink coated thereon and the conductive interconnection structures 121 of the substrate 120 to be bonded to each other. Note that, as discussed herein, the conductive interconnection structures 121 of the substrate 120 may also (or alternatively) be coated with the ink. In an example implementation, block 190 may comprise performing the bonding without the utilization of ultrasonic vibration and/or without the utilization of solder reflow (or without the utilization of epoxy bonding). This may, for example, different from other direct metal-to-metal bonding techniques (e.g., direct copper-to-copper bonding techniques, etc.), in which ultrasonic energy is used to enhance the bonding process.

In an example implementation utilizing thermocompression bonding, the temperature of the thermocompression bonding may be between 25° C. and 400° C. (or in a range from 25° C. to 400° C.). In this case, if the temperature of the thermocompression bonding is higher than 25° C., an intermetallic compound is efficiently formed across interface 125 between and/or into the conductive interconnection structures 111/121, where the intermetallic compound can include at least portions (e.g., metal portions) of the ink diffused into interconnection structure 111/121, thereby providing a high bonding strength. In addition, if the temperature of the thermocompression bonding is lower than 400° C., the semiconductor die 110 and the substrate 120 might not be substantially adversely affected by the temperature of the thermocompression bonding.

Also for example, the pressure of the thermocompression bonding may be between 0.1 bar and 20 Kbar (or in the range from 0.1 bar to 20 Kbar). In this case, if the pressure is higher than 0.1 bar, the positions of the conductive interconnection structures 111/121 may be efficiently fixed when the intermetallic compound is formed using the conductive interconnection structures 111/121 and the ink. In addition, if the pressure is lower than 20 Kbar, deformation of the conductive interconnection structures 111/121 can be prevented (or reduced), for example when the conductive interconnection structures 111/121 are misaligned.

As shown in FIG. 2F, when the intermetallic bond is completely formed between the conductive interconnection structures 111/121, the interface 125 may partially or virtually wholly disappear, resulting in the bonding region 130. In this manner, a semiconductor device having a bonding region 130 in the final product resulting from the bonding of the conductive interconnection structures 111/121 (and/or metal parts of the ink) can be manufactured. The bonding region 130 may, for example, maintain a securely bonded state by forming an intermetallic compound (IMC), enhanced by the ink (or a portion thereof) positioned at a boundary between the conductive interconnection structures 111/121. Thus, the bonding region 130 may provide a higher bonding strength than in the case of a bonding method using a conventional solder.

After the bonding has been completed, block 190 may comprise removing the die manipulation tool 22 and the stage 40.

In general, block 190 may comprise bonding the semiconductor die to the substrate. Accordingly, the scope of this disclosure should not be limited by characteristics of any particular bond or any particular manner of forming such bond.

The example method 101 may comprise continuing execution at block 195. Block 195 may, for example, comprise directing execution flow of the example method 101 to any block (or step) of the method 101 (or portion thereof). Also for example, block 195 may comprise directing execution flow of the example method 101 to next steps for forming a semiconductor package, for example, encapsulating the bonded conductive interconnection structures 111/121 in an underfill and/or molding material, stacking one or more additional dies on the assembly, encapsulating the package, back-grinding or otherwise thinning the die 110 and/or the substrate 120, etc.

Various aspects of the present disclosure will now be presented in the context of photographic images. In particular, FIGS. 3A to 3B show illustrative cross-sectional drawings and/or images of an electronic device in accordance with various aspects of the present disclosure.

Figure 3A:
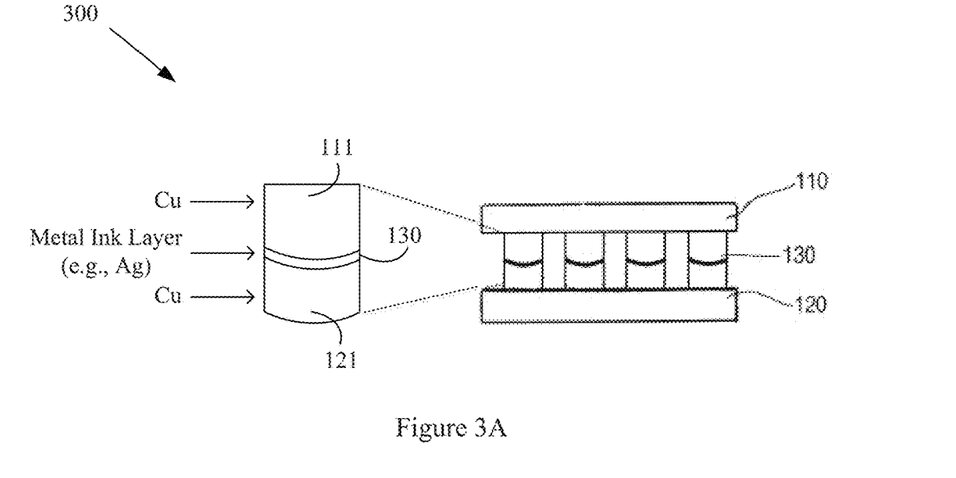
FIGS. 3A to 3B show illustrative cross-sectional drawings and/or images of an electronic device in accordance with various aspects of the present disclosure.
Figure 3B:
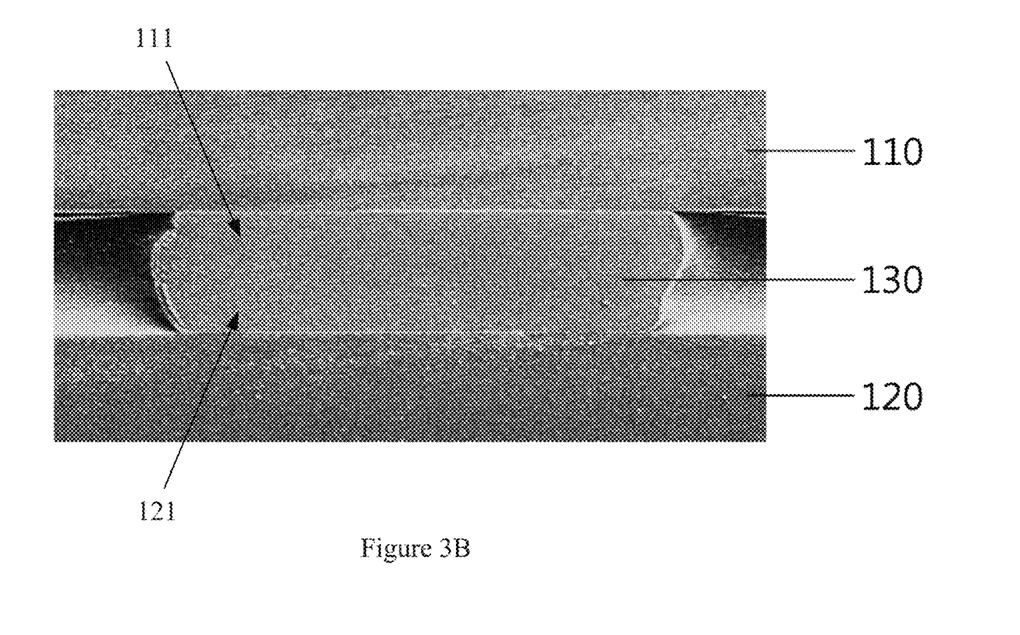

The example images of FIGS. 3A to 3B show bonding regions 130 between the semiconductor die 110 and the substrate 120. As shown in FIGS. 3A and 3B, the metal-to-metal bond (e.g., copper-to-copper bond, copper-to-copper bond with silver particles, etc.) formed between the conductive interconnection structures 111/121 is efficiently formed utilizing the methods discussed herein. In fact, the bonding region 130 (and/or the original interface 125 that existed when the conductive interconnection structures 111/121 were initially brought into contact) between the conductive interconnection structures 111/121 may be challenging to detect in various scenarios without, for example, an energy-dispersive spectroscopy (EDS) analysis.

As discussed herein, the bonding region 130 may comprise an intermetallic compound formed from the respective metals at the ends of the conductive interconnection structures 111/121 and from the metal (e.g., silver) in the ink. Thus, the bonding region 130 having a very high quality may be formed utilizing a bonding process (e.g., thermoscompression bonding) that does not include utilizing a solder material and/or utilizing ultrasonic bonding techniques. In other words, the bonding region 130 may be formed in an economically efficient manner and still have a very high quality. Additionally, the methods discussed herein provide for finer pitch interconnection structures than provided by other methods (e.g., solder-based methods, etc.) that may for example require additional buffer space for the flow (or reflow) of bonding material (e.g., solder flow, epoxy flow, etc.). The bonding region 130 formed in accordance with various aspects of this disclosure also has superior electrical conductivity through the bonding region 130, enhancing the performance of the electronic device. The bonding region 130 formed in accordance with various aspects of this disclosure also exhibits superior joint quality (e.g., enhanced bonding strength, low joint failure rates, etc.).

In an example implementation, the bonding region 130 may comprise a thin layer of pure silver with no copper. The bonding region 130 may, in an example implementation, comprise a thickness between 1 nm and 10 um. For example, the bonding region 130 may comprise a thickness between 1 um and 10 um. In another example implementation, the bonding region 130 may comprise Cu—Ag intermetallic bonds and may also comprise Cu—Cu intermetallic bonds.

In summary, various aspects of this disclosure a method of manufacturing an electronic device and an electronic device manufactured thereby. As a non-limiting example, various aspects of this disclosure provide a method of manufacturing an electronic device, and an electronic device manufactured thereby, that utilizes ink to form an intermetallic bond between respective conductive interconnection structures of a semiconductor die and a substrate. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a first component comprising a first conductive interconnection structure, the first conductive interconnection structure comprising:
      a first end comprising a first lateral width; and
      a second end opposite the first end and comprising a second lateral width that is less than the first lateral width;
   a second component comprising a second conductive interconnection structure, the second conductive interconnection structure comprising a first end; and
   a solderless bonding region comprising the first end of the first conductive interconnection structure and the first end of the second conductive interconnection structure, wherein the solderless bonding region comprises:
      a first metal from the first end of the first conductive interconnection structure;
      a second metal from the first end of the second conductive interconnection structure; and
      an intermetallic bond comprising the first metal from the first end of the first conductive interconnection structure, and the second metal from the first end of the second conductive interconnection structure.

2. The electronic device of claim 1, wherein the first end of the first conductive interconnection structure and/or the first end of the second conductive interconnection structure comprises a bulge protruding laterally therefrom.

3. The electronic device of claim 2, wherein the bulge comprises a metal that is distinct from the first metal and the second metal.

4. The electronic device of claim 2, wherein the bulge comprises a metal that is a remnant of a metal-filled solution.

5. The electronic device of claim 2, wherein the bulge comprises remnants of a solution coated on the first end of the first conductive interconnection structure.

6. The electronic device of claim 1, wherein the first end of the first conductive interconnection structure comprises a horizontal surface that is coated with a conductive material, and a vertical surface that is coated with the conductive material.

7. The electronic device of claim 1, wherein the first metal comprises copper, and the second metal comprises copper.

8. The electronic device of claim 1, wherein the first end of the first conductive interconnection structure comprises a horizontal surface that is coated with a conductive material, having a thickness between 1 nanometer and 10 micrometers.

9. The electronic device of claim 1, wherein the first end of the first conductive interconnection structure comprises a peripheral convex surface.

10. An electronic device comprising:
    a first component comprising a first conductive interconnection structure;
    a second component comprising a second conductive interconnection structure; and
    a solderless bonding region comprising a first end of the first conductive interconnection structure and a first end of the second conductive interconnection structure, wherein the solderless bonding region comprises:
       a first metal from the first end of the first conductive interconnection structure;
       a second metal from the first end of the second conductive interconnection structure; and
       an intermetallic bond comprising the first metal from the first end of the first conductive interconnection structure, and the second metal from the first end of the second conductive interconnection structure,
    wherein the first end of the first conductive interconnection structure comprises a peripheral convex surface.

11. The electronic device of claim 10, wherein the first end of the second conductive interconnection structure comprises a flat surface.

12. The electronic device of claim 10, wherein:
    the first end of the first conductive interconnection structure comprises a first lateral width; and
    the first end of the second conductive interconnection structure comprises a second lateral width different from the first lateral width.

13. The electronic device of claim 10, wherein:
    the first conductive interconnection structure comprises a pillar; and
    the second conductive interconnection structure comprises a pedestal.

14. The electronic device of claim 10, wherein the first end of the first conductive interconnection structure comprises a horizontal surface that is coated with a conductive material, and a vertical surface that is coated with the conductive material.

15. The electronic device of claim 10, wherein the first end of the second conductive interconnection structure comprises a bulge protruding laterally therefrom.

16. The electronic device of claim 15, wherein the bulge comprises a metal that is distinct from the first metal and the second metal.

17. A method of making an electronic device, the method comprising:
    providing a first component comprising a first conductive interconnection structure, the first conductive interconnection structure comprising:
       a first end comprising a first lateral width; and
       a second end opposite the first end and comprising a second lateral width;
    providing a second component comprising a second conductive interconnection structure, the second conductive interconnection structure comprising a first end comprising a second lateral width; and
    forming a solderless bonding region comprising a first end of the first conductive interconnection structure and a first end of the second conductive interconnection structure, wherein the solderless bonding region comprises:

a first metal from the first end of the first conductive interconnection structure;
a second metal from the first end of the second conductive interconnection structure; and
an intermetallic bond comprising the first metal from the first end of the first conductive interconnection structure, and the second metal from the first end of the second conductive interconnection structure, wherein:
the first lateral width of the first conductive interconnection structure is wider than the second lateral width of the first conductive interconnection structure; and/or
the first end of the first conductive interconnection structure comprises a peripheral convex surface.

18. The method of claim 17, wherein the first lateral width of the first conductive interconnection structure is wider than the second lateral width of the first conductive interconnection structure.

19. The method of claim 17, wherein the first end of the second conductive interconnection structure comprises a flat surface.

20. The method of claim 17, wherein said forming the solderless bonding region comprises forming the solderless bonding region in a temperature range of 25-400 degrees Celsius.

* * * * *